(12) United States Patent
Nakamura et al.

(10) Patent No.: US 7,642,646 B2
(45) Date of Patent: Jan. 5, 2010

(54) SEMICONDUCTOR DEVICE AND METHOD OF MANUFACTURING THE SAME

(75) Inventors: Yoshifumi Nakamura, Hirakata (JP); Takayuki Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 132 days.

(21) Appl. No.: 11/050,698

(22) Filed: Feb. 7, 2005

(65) Prior Publication Data

US 2005/0173798 A1    Aug. 11, 2005

(30) Foreign Application Priority Data

Feb. 10, 2004    (JP)    ............................. 2004-032771
Jan. 5, 2005     (JP)    ............................. 2005-000305

(51) Int. Cl.
*H01L 23/489*    (2006.01)
(52) U.S. Cl. ............................. 257/737; 257/E23.068
(58) Field of Classification Search ......... 257/734–738, 257/758, 779, 792, E23.068
See application file for complete search history.

(56) References Cited

U.S. PATENT DOCUMENTS

| | | | | |
|---|---|---|---|---|
| 6,100,589 | A * | 8/2000 | Tanaka ........................ | 257/758 |
| 6,118,180 | A * | 9/2000 | Loo et al. .................... | 257/737 |
| 6,130,149 | A * | 10/2000 | Chien et al. ................. | 438/613 |
| 6,479,376 | B1 * | 11/2002 | Huang et al. ................ | 438/613 |
| 6,636,313 | B2 * | 10/2003 | Chen et al. .................. | 356/401 |
| 6,639,314 | B2 * | 10/2003 | Boettcher et al. ........... | 257/736 |
| 6,683,384 | B1 * | 1/2004 | Kossives et al. ............. | 257/777 |
| 6,881,654 | B2 * | 4/2005 | Chen et al. .................. | 438/497 |
| 7,015,590 | B2 * | 3/2006 | Jeong et al. ................. | 257/780 |
| 7,061,785 | B2 * | 6/2006 | Miwa et al. ................. | 365/63 |
| 7,075,179 | B1 * | 7/2006 | Ali et al. .................... | 257/691 |
| 7,134,199 | B2 * | 11/2006 | Su et al. ..................... | 29/843 |
| 7,170,170 | B2 * | 1/2007 | Yeo ............................ | 257/737 |
| 2002/0043723 | A1 * | 4/2002 | Shimizu et al. ............. | 257/758 |
| 2003/0034567 | A1 * | 2/2003 | Sato et al. ................... | 257/786 |
| 2004/0087129 | A1 * | 5/2004 | Chen et al. .................. | 438/613 |
| 2004/0180296 | A1 * | 9/2004 | Chen et al. .................. | 430/315 |
| 2005/0017355 | A1 * | 1/2005 | Chou et al. .................. | 257/738 |
| 2005/0067706 | A1 * | 3/2005 | Yamagata .................... | 257/758 |
| 2006/0049525 | A1 * | 3/2006 | Lin et al. .................... | 257/758 |

FOREIGN PATENT DOCUMENTS

| | | |
|---|---|---|
| JP | 2001-110833 | 4/2001 |
| JP | 2002-170826 | 6/2002 |
| JP | 2003-347338 | 12/2003 |

* cited by examiner

*Primary Examiner*—Nathan W Ha
(74) *Attorney, Agent, or Firm*—Steptoe & Johnson LLP

(57) ABSTRACT

A semiconductor device is configured such that an electrode pad connected to an internal circuit is formed on a surface of a semiconductor substrate, wires are formed near and around the electrode pad, a protective film is formed which covers the edge of the electrode pad, the wires, and the surface of the semiconductor substrate, and a metal bump is formed on the electrode pad such that the edge of the electrode is disposed on the protective film on the wires. According to this configuration, since the wires are formed near the electrode pad, the protective film covering the edge of the electrode pad and an area around the edge is formed relatively flat, and the metal bump has a flat surface on a convex portion formed on the relatively flat protective film. Therefore, even when the electrode pad is small, a flat area can be sufficiently obtained on the surface of the metal bump, thereby obtaining stable connection via an anisotropic conductive sheet or the like by COG.

6 Claims, 11 Drawing Sheets

SEMICONDUCTOR DEVICE AND METHOD OF MANUFACTURING THE SAME

FIELD OF THE INVENTION

The present invention relates to a semiconductor device and a method of manufacturing the same.

BACKGROUND OF THE INVENTION

In recent years, demand for liquid crystal panels has sharply grown due to the proliferation of notebook computers and liquid crystal televisions. Semiconductor devices for operating liquid crystal panels have also rapidly grown in demand. Meanwhile, the need for lower costs of liquid crystal panels and semiconductor devices intensifies in order to achieve popularly priced notebook computers and so on. Thus, methods including Tape Carrier Package (TCP) and Chip On Glass (COG) are frequently used, in which semiconductor devices are directly mounted on a mounting substrate by using an anisotropic conductive sheet and so on. In TCP and COG, an important technical challenge is a stable connection between a mounting substrate and an external electrode of a semiconductor device.

FIG. 10 shows a typical arrangement of input/output pads serving as external electrodes on a semiconductor device (semiconductor chip). Input/output pads 23 are disposed on the edge of a semiconductor device 22 that is disposed outside an active area 21 which has a semiconductor element and constitutes a circuit. As enlarged in FIG. 11, the input/output pad 23 comprises at least an electrode pad 2 which is formed on a surface of a semiconductor substrate 1 and is mainly composed of an aluminum alloy and a metal bump 3 which is formed thereon to make connection with an external lead and is made of a material such as Au and Ni. In order to form the metal bump 3 by electrolytic plating and so on, a protective film 4 is formed beforehand so as to cover the edge of the electrode pad 2. A barrier metal layer 5 is formed depending upon a combination of materials of the electrode pad 2 and the metal bump 3. In some arrangements, for more reliable lead connection of TCP, the metal bump 3 is expanded larger than the electrode pad 2 at least in one direction to have a larger connection area (not shown, see Japanese Patent Laid-Open No. 2001-110833).

However, when the protective film 4 is formed thus so as to cover the edge of the electrode pad 2, a step appears between a surface of the protective film 4 and a surface of the electrode pad 2 not being covered with the protective film 4, and a step appears on a surface of the metal bump 3 formed thereon. That is, since the metal bump 3 is formed on the uneven surfaces of the electrode pad 2 and the protective film 4 by electrolytic plating and so on, a convex portion 3a and a concave portion 3b are formed on the metal bump 3. Despite of the occurrence of steps, electrolytic plating is used under present circumstances because other techniques cannot stably form the protrusion of the metal bump 3.

However, when the metal bump 3 is connected onto a mounting substrate via an anisotropic conductive sheet by COG and so on, some portions may not permit the contact of conductive particles in the anisotropic conductive sheet due to the presence of a step. When the conductive particles do not make sufficient contact, a connection resistance of the semiconductor device and the mounting substrate becomes larger than a design value or is varied. For example, one solution is to make conductive particles sufficiently larger than a step. However, a short circuit is more likely to occur on the adjacent metal bump 3 and thus this solution is difficult to use for the semiconductor device of a small pitch.

The present invention is devised to solve the problem and has an object to provide a semiconductor device which can obtain the connection stability of a metal bump for external connection and a method of manufacturing the same.

DISCLOSURE OF THE INVENTION

In order to solve the problem, a semiconductor device of the present invention, wherein an electrode pad connected to an internal circuit is formed on a surface of a semiconductor substrate, wires are formed near and around the pad, a protective film is formed which covers the edge of the electrode pad, the wires, and the surface of the semiconductor substrate, and a metal bump is formed on the electrode pad such that the edge of the electrode is disposed on the protective film on the wires.

According to this configuration, since the wires are formed near the electrode pad, the protective film covering the edge of the electrode pad and an area around the edge is formed relatively flat, and the metal bump has a flat surface because the edge of the electrode is disposed on the relatively flat protective film. Therefore, even when the electrode pad is small, it is possible to sufficiently obtain a flat area on the surface of the metal bump, thereby obtaining stable connection via an anisotropic conductive sheet or the like.

The wires may be formed around a plurality of electrode pads, the protective film may be formed so as to cover the edges of the electrode pads, the wires, and the surface of the semiconductor substrate, and the metal bump may be formed so as to connect the plurality of electrode pads.

One or more wires may be disposed along the outer edge of the electrode pad, and the metal bump may be formed such that the edge of the electrode is disposed on the protective film on the one or more wires and the electrode pad.

Further, one or more wires may be disposed around the electrode pad, and the metal bump may be formed such that the edge of the electrode is disposed on the protective film on the one or more wires.

The wire may be formed between the adjacent electrode pads.

It is preferable that the metal bump have an outer edge disposed inside an inclined portion formed on the protective film according to a step between the outermost edge of the arranged electrode pad and wire and the surface of the semiconductor substrate outside the outermost edge.

It is preferable that the plurality of wires be formed outside the electrode pad at proper intervals and a plurality of inclined portions be continuously formed on the surface of the protective film on a gap between the electrode pad and the wire and a gap between the wires.

It is preferable that an inclined portion have a step of 1 μm or less, the inclined portion being formed on the surface of the protective film on a gap between the electrode pad and the wire or a gap between the plurality of wires.

The edges of the three sides of the rectangular metal bump may be disposed on the protective film on the single electrode pad or the wires.

It is preferable that the outer edge of the electrode pad, on which the edges of the three sides of the metal bump are disposed, or the wire be arranged along the outer edge of the semiconductor substrate.

It is preferable that the outer edge of the electrode pad, on which the edges of the three sides of the metal bump are disposed, or the wire be arranged near the outer edge of the semiconductor substrate.

The wires may be continuously formed around the electrode pad.

A method of manufacturing a semiconductor device according to the present invention, comprising the steps of forming a protective film on a semiconductor substrate on which an electrode pad is formed and wires are formed near and around the electrode pad, the protective film covering an edge of the electrode pad, the wires disposed around the electrode pad, and a surface of the semiconductor substrate, and forming a metal bump by growing a metallic material in an area ranging from the electrode pad to the wires.

DESCRIPTION OF THE EMBODIMENTS

The following will describe embodiments of the present invention in accordance with the accompanying drawings.

Figure 1:
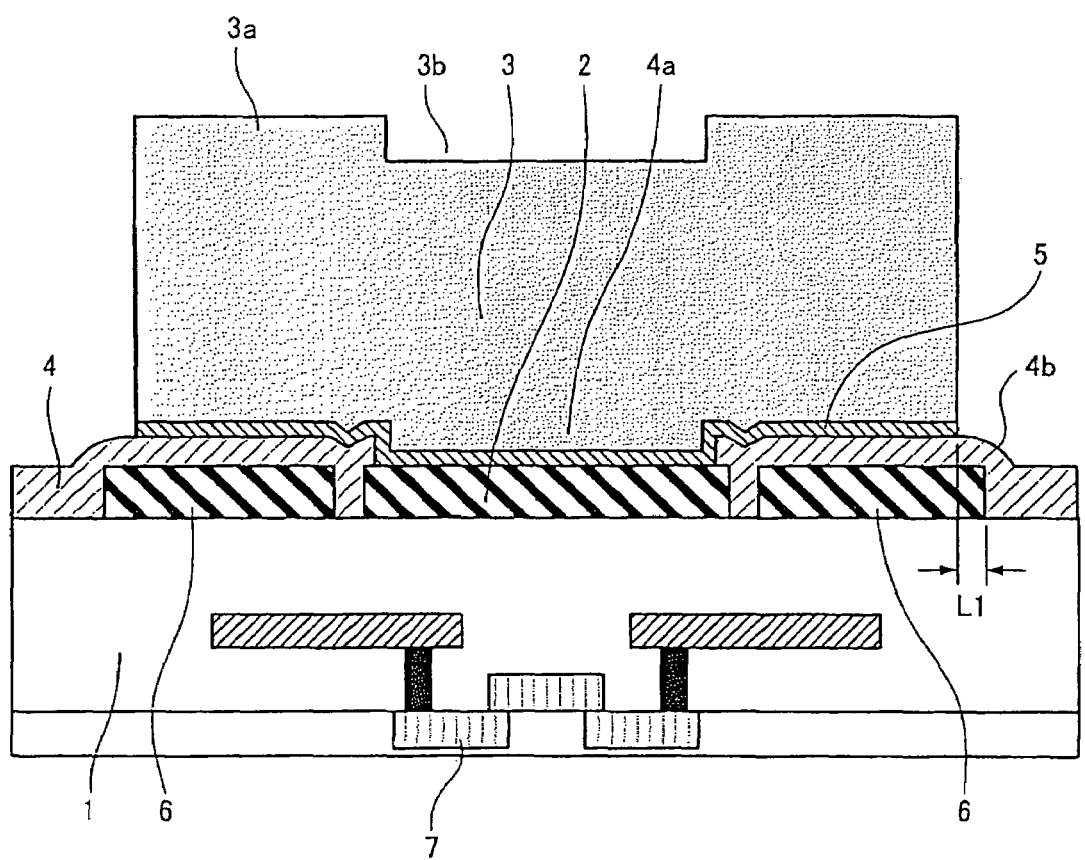
FIG. 1 is a sectional view showing an input/output pad of a semiconductor device according to an embodiment of the present invention.
Figure 2:
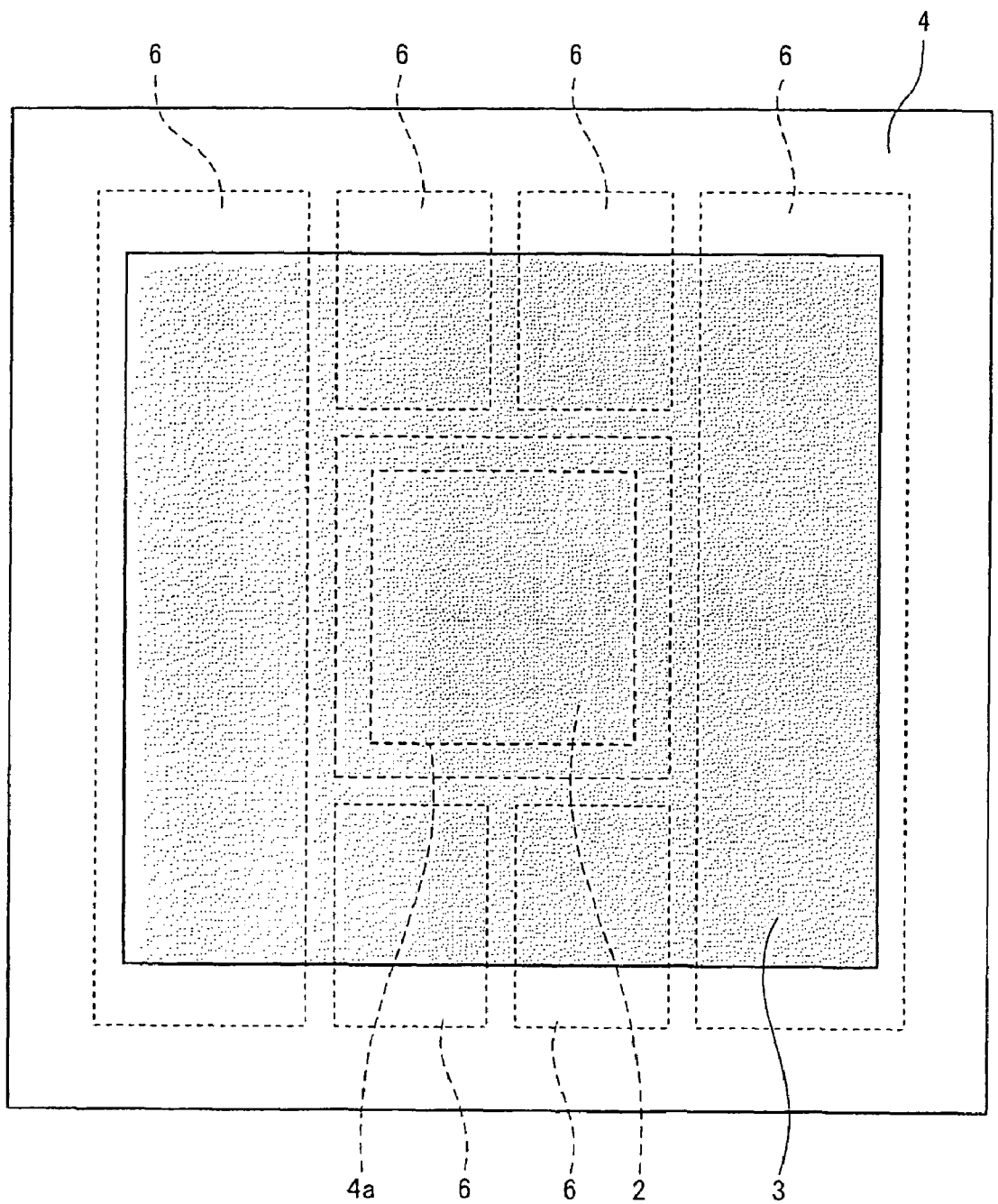
FIG. 2 is a plan view showing the input/output pad of the semiconductor device shown in FIG. 1.
Figure 10:
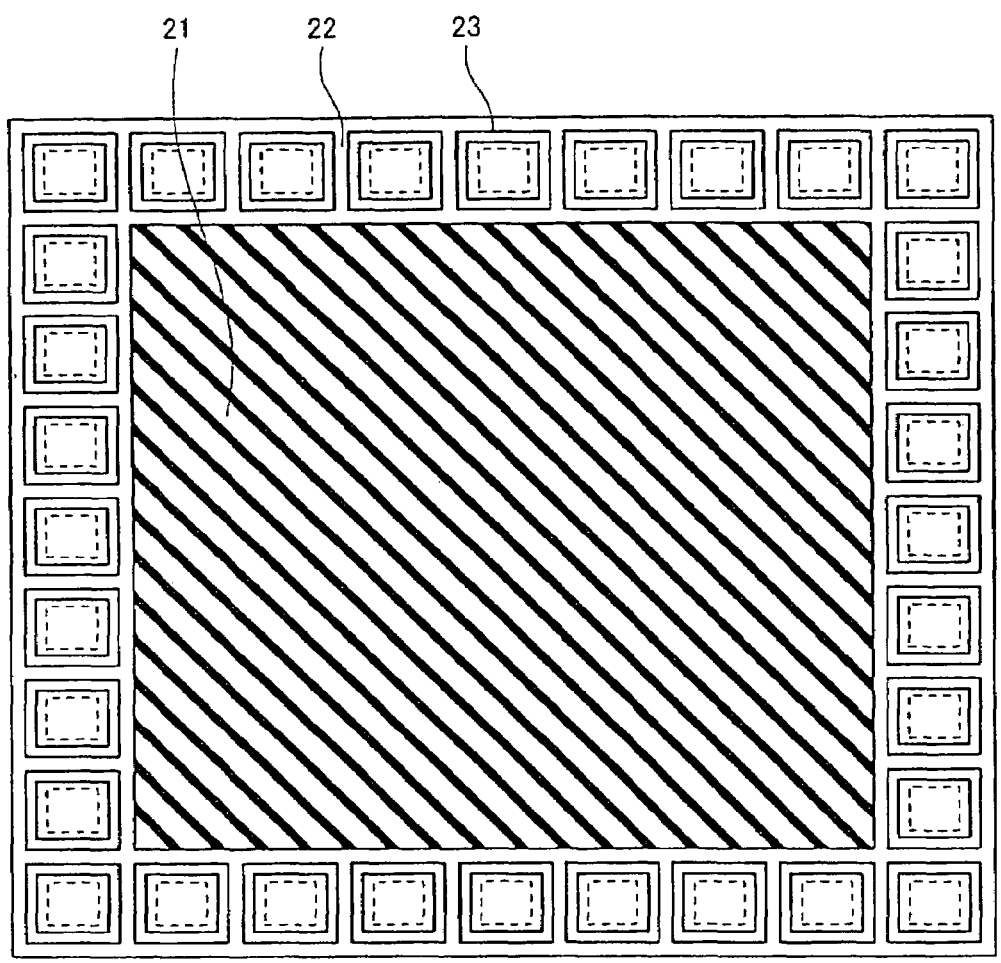
FIG. 10 is a plan view showing a schematic configuration of a conventional semiconductor device.
Figure 11:
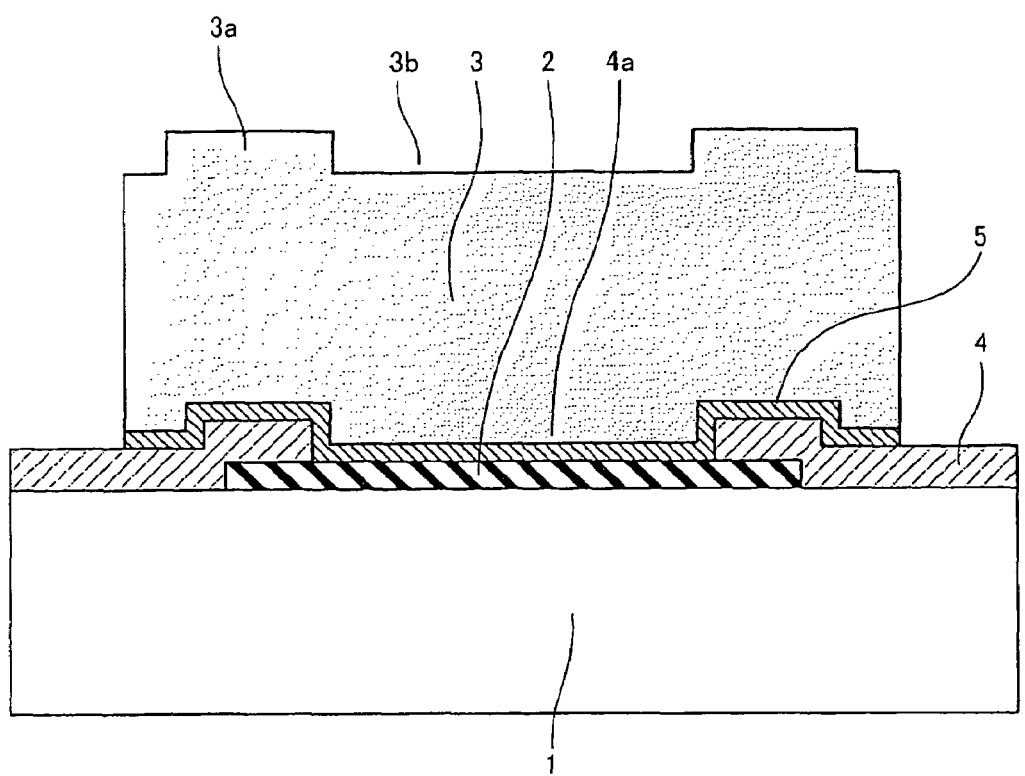
FIG. 11 is a sectional view showing an input/output pad of a conventional semiconductor device.

FIG. 1 is a sectional view showing the structure of an input/output pad of a semiconductor device according to an embodiment of the present invention. FIG. 2 is a plan view showing the input/output pad. In the semiconductor device (semiconductor chip), the input/output pads are generally positioned outside an active area and on the edge of a semiconductor substrate (See FIG. 10). In the active area, semiconductor elements including a transistor, a resistor, a capacitor, a diode, and wires are formed and an internal circuit is constructed.

In FIGS. 1 and 2, on a surface of a semiconductor substrate 1, an electrode pad 2 connected to an internal circuit and a plurality of wires 6 are formed in the same layer and at least a protective layer 4 is formed so as to cover the edge of the electrode pad 2, the wires 6, and the surface of the semiconductor substrate 1. On the electrode pad 2 exposed from an opening 4a of the protective film 4 and on the protective film 4, a metal bump 3 is formed via a barrier metal layer 5. An active area 7, in which a transistor or the like is formed, may be provided in the semiconductor substrate 1 under the electrode pad 2.

The plurality of wires 6 are formed near the electrode pad 2 so as to surround the rectangular electrode pad 2. The wires 6 have the same thickness as the electrode pad 2 and are arranged in parallel at certain intervals. To be specific, some of the wires 6 are disposed near a pair of parallel sides of the rectangular electrode pad 2 so as to stretch along the sides, and the other wires 6 are formed near the other pair of sides so as to stretch in a direction intersecting the sides. The wires 6 and the electrode pad 2 constitute a rectangular area. The wires 6 are electrically isolated from or connected to the electrode pad 2 and are connected to the internal circuit. Alternatively, the wires 6 are formed as dummy wires which are not connected to the internal circuit.

The protective film 4 of almost even thickness is formed on the edge of the electrode pad 2, the wires 6, and a surface of the semiconductor substrate 1 around the wires 6. The protective film 4 is inclined on boundaries between the surface of the semiconductor substrate 1 and the electrode pad 2 and the wires 6.

The metal bump 3 is formed as follows: the center of the metal bump 3 is disposed on the electrode pad 2 and the outer edge of the metal bump 3 is positioned inside an inclined portion 4b of the protective film 4 on the boundary between the outer edge of the wire 6 and the surface of the semiconductor substrate 1 (hereinafter, simply referred to as the inclined portion 4b of the protective film 4). In this arrangement, a distance between the metal bump 3 and the inclined portion 4b is represented as L1. A surface of the metal bump 3 becomes uneven depending upon a height difference between the surface of the electrode pad 2 exposed from the opening 4a of the protective film 4 and the surface of the protective film 4. Hereinafter, a high portion on the protective film 4 will be referred to as a convex portion 3a and a low portion on the electrode pad 2 exposed from the opening 4a will be relatively referred to as a concave portion 3b.

A method of manufacturing the semiconductor device will be described below in accordance with process drawings shown in FIGS. 3A to 3D.

Figure 3A:
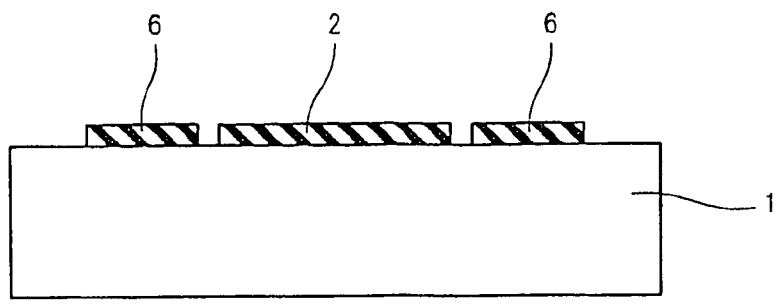
FIGS. 3A to 3D illustrate processes of a manufacturing method of the semiconductor device shown in FIG. 1.

As shown in FIG. 3A, the electrode pad 2 and the wires 6 are formed on the semiconductor substrate 1, in which semiconductor elements have been formed, by sputtering and CVD. An electric conductor predominantly composed of Al and Cu can be preferably used as materials of the electrode pad 2 and the wires 6.

Figure 3B:
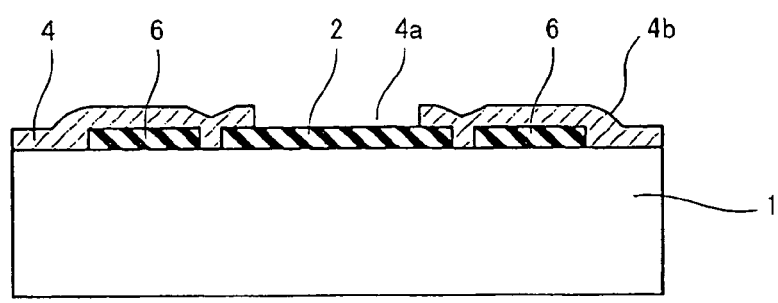

Subsequently, as shown in FIG. 3B, the protective film 4 with the opening 4a is formed. The protective film 4 is formed using CVD and can be patterned by techniques such as photolithography and dry etching. SiN and a material predominantly composed of Si and Ga can be preferably used as a material of the protective film 4. In film formation of CVD and so on, a film is formed according to a pattern on the substrate. However, on a boundary, the film is not formed completely according to the pattern and the inclined portion 4b or the like is formed.

Figure 3C:
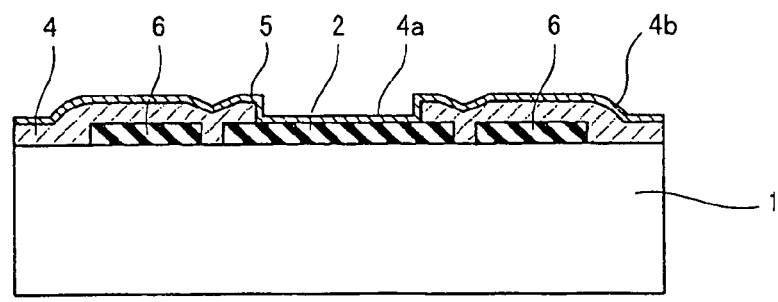

Subsequently, as shown in FIG. 3C, a barrier metal layer 5 of a desired thickness is formed over the electrode pad 2 and the protective film 4 by sputtering and so on. In addition to Ti, a material including TiW, W, Pd, and Cr can be used for the barrier metal layer 5.

Figure 3D:
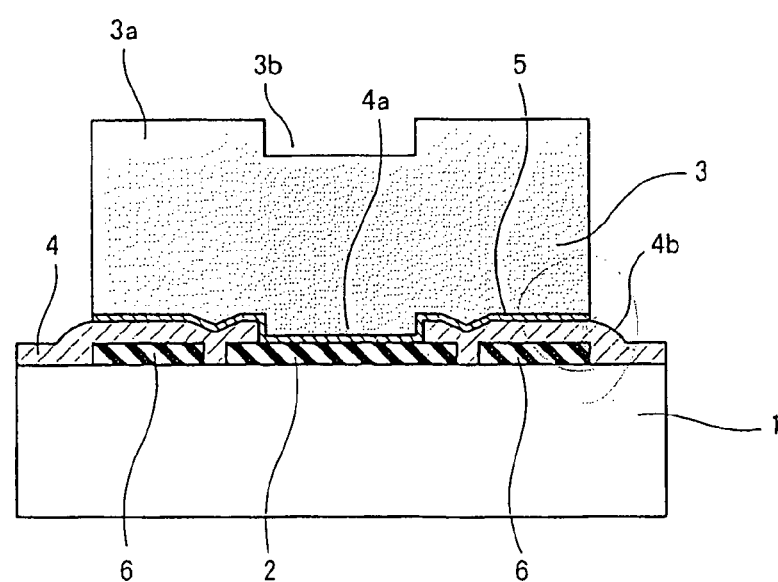

Then, as shown in FIG. 3D, the metal bump 3 is formed on the electrode pad 2 via the barrier metal layer 5. As described above, the metal bump 3 is formed with the outer edge positioned inside the inclined portion 4b of the protective film 4. In general, a technique such as photolithography and electrolytic plating is used to form the metal bump 3 of a desired size on a desired position. In this case, metal plating is grown with the barrier metal layer 5 serving as a seed layer, the metal bump 3 is patterned, the barrier metal layer 5 outside the metal bump 3 is etched with the metal bump 3 serving as a mask. A material such as Au and Ni can be used for the metal bump 3.

The electrode pad 2 is melted depending upon a combination of materials of the electrode pad 2 and the metal bump 3 during the formation of the metal bump 3. Thus, it is desirable to interpose the barrier metal layer 5 to avoid such melting.

In such an input/output pad, since the metal bump 3 is formed inside the inclined portion 4b of the protective film 4, an uneven shape is generally formed only by a step on the opening 4a of the protective film 4. On a gap between the wires 6 and a gap between the electrode pad 2 and the wire 6, steps formed on the surface of the protective film 4 are small and thus hardly affect the metal bump 3. Hence, the upper face of the convex portion 3a of the metal bump 3 has a larger area and becomes almost flat as compared with the conventional structure having no wire near the electrode pad 2. Therefore, the metal bump 3 is more likely to make contact with conductive filler in an anisotropic conductive sheet, which is disposed between the metal bump 3 and a mounting substrate such as a glass substrate, thereby obtaining stable bonding. Also during mounting by adding weight from the surface of the metal bump 3, a defect such as a crack is unlikely to occur on the protective film 4, thereby achieving mounting with a highly stable resistance value. The weight added during mounting is received by the electrode pad 2 and the wires and thus has only a slight influence on the active area 7 under the electrode pad 2.

A specific example of the input/output pad shown in FIGS. 1 and 2 will be discussed below. The electrode pad 2 was formed with a size of 40×40 μm, the wires 6 were formed with a width of 30 μm, an interval between the wire 6 and the electrode pad 2 was 1 μm, and the electrode pad 2 and the wires 6 were formed with a thickness of 900 nm. The protective film 4 was formed thereon with a thickness of about 1000 nm, the barrier metal layer 5 was formed thereon with a thickness of 200 nm, and the metal bump 3 was formed thereon with a thickness of 17 μm such that the outer edge of the metal bump 3 is disposed inside the inclined portion 4b of the protective film 4 by 2 μm.

As a result, the protective film 4 had a step of 300 nm due to a gap between the wires 6, whereas any uneven portion was not particularly formed on the top face of the convex portion 3a of the metal bump 3. The convex portion 3a was positioned on the step. The semiconductor device having this electrode structure was mounted while a weight was added from the surface of the metal bump 3. In this case, bonding was preferably performed without causing any defects such as a crack on the protective film 4.

FIGS. 4 to 8 show layouts of electrode pads, wires, and metal bumps in other input/output pads of the present invention. The arrangements of the protective film 4 and the barrier metal layer 5 are similar to those of FIG. 1 and thus the illustration thereof is omitted.

Figure 4:
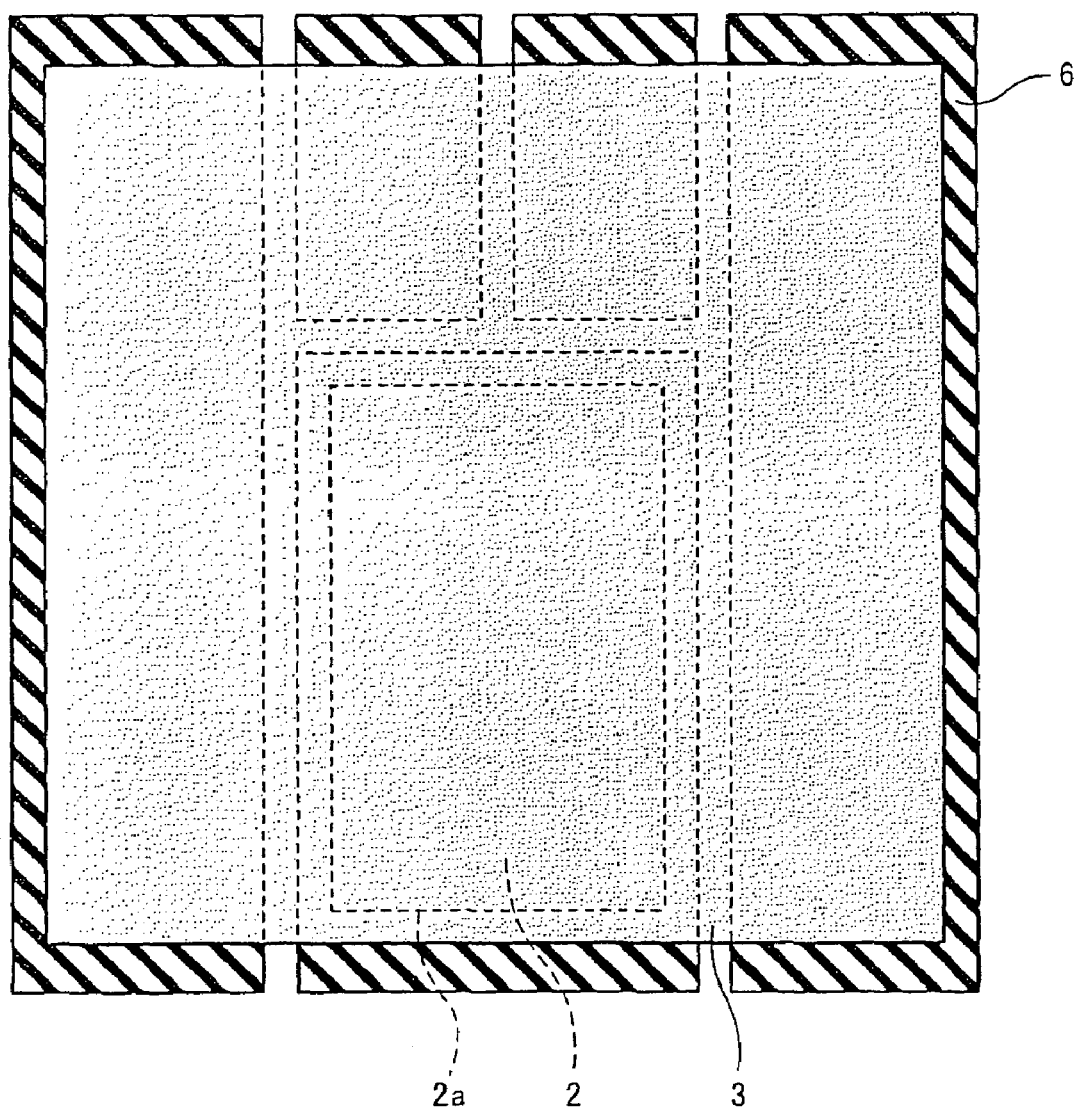
FIG. 4 is a layout showing an electrode pad, wires, and a metal bump in another input/output pad of the present invention.

In the input/output pad of FIG. 4, wires 6 are disposed on the three sides of a rectangular electrode pad 2, and a metal bump 3 is disposed on the electrode pad 2 and the wires 6. Reference character 2a denotes a portion of the electrode pad 2 that is exposed from a protective film. Also in this electrode structure, the metal bump 3 is formed inside an inclined portion 4b of the protective film 4 as in FIG. 1, thereby obtaining the same effect as the electrode structure of FIG. 1. In this structure where the electrode pad 2 is partially drawn outside the metal bump 3, a degree of freedom for routing the electrode pad 2 and the wires 6 also increases.

Figure 5:
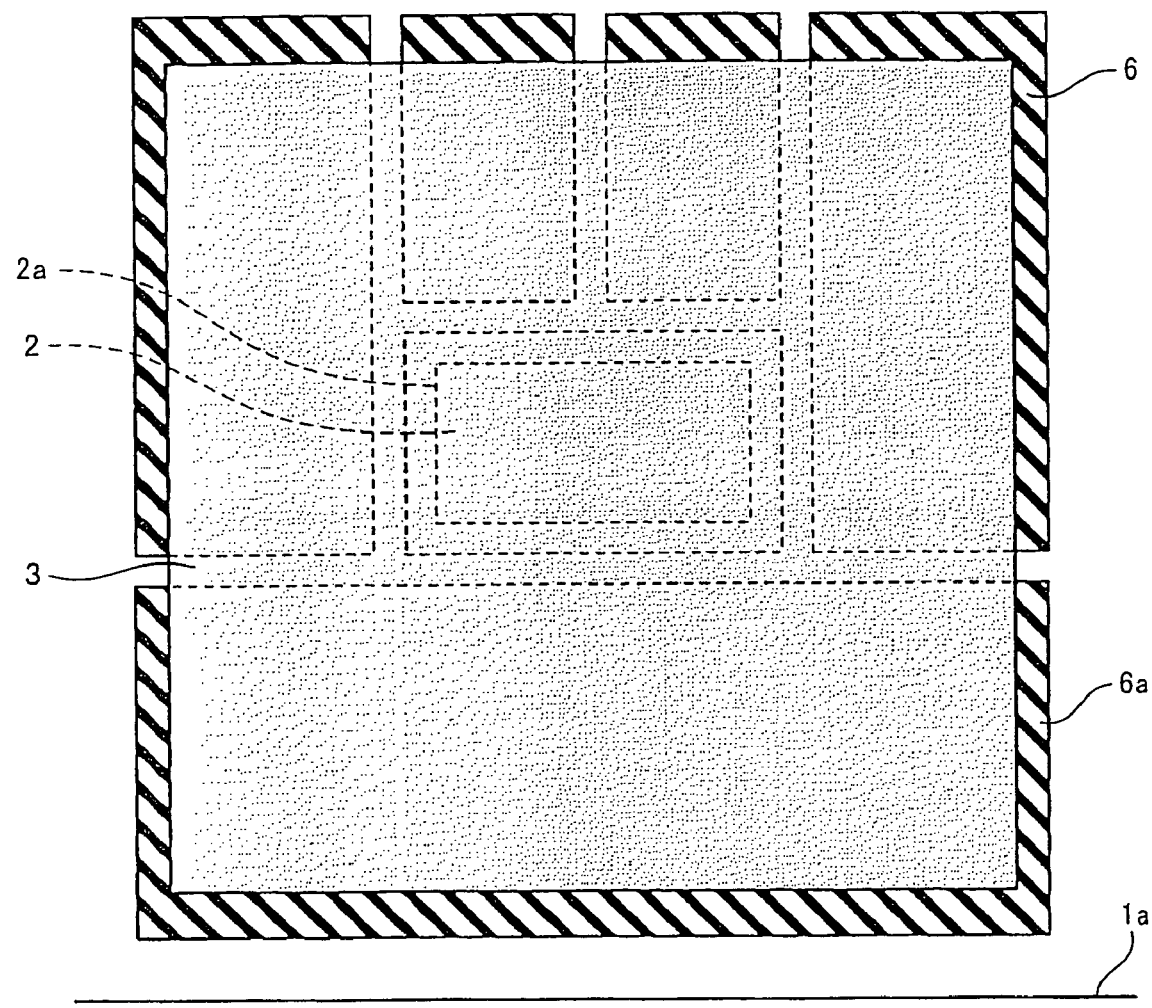
FIG. 5 is a layout showing an electrode pad, wires, and a metal bump in still another input/output pad of the present invention.

In the input/output pad of FIG. 5, of a plurality of wires 6 formed around a rectangular electrode pad 2, a wire 6a is disposed along an edge 1a of the semiconductor substrate 1, and a metal bump 3 is disposed on the wire 6a, the electrode pad 2 positioned inside the wire 6a, and the wires 6. Also in this electrode structure, the metal bump 3 is formed inside an inclined portion 4b of the protective film 4 as in FIG. 1, thereby obtaining the same effect as the electrode structure of FIG. 1.

Figure 6:
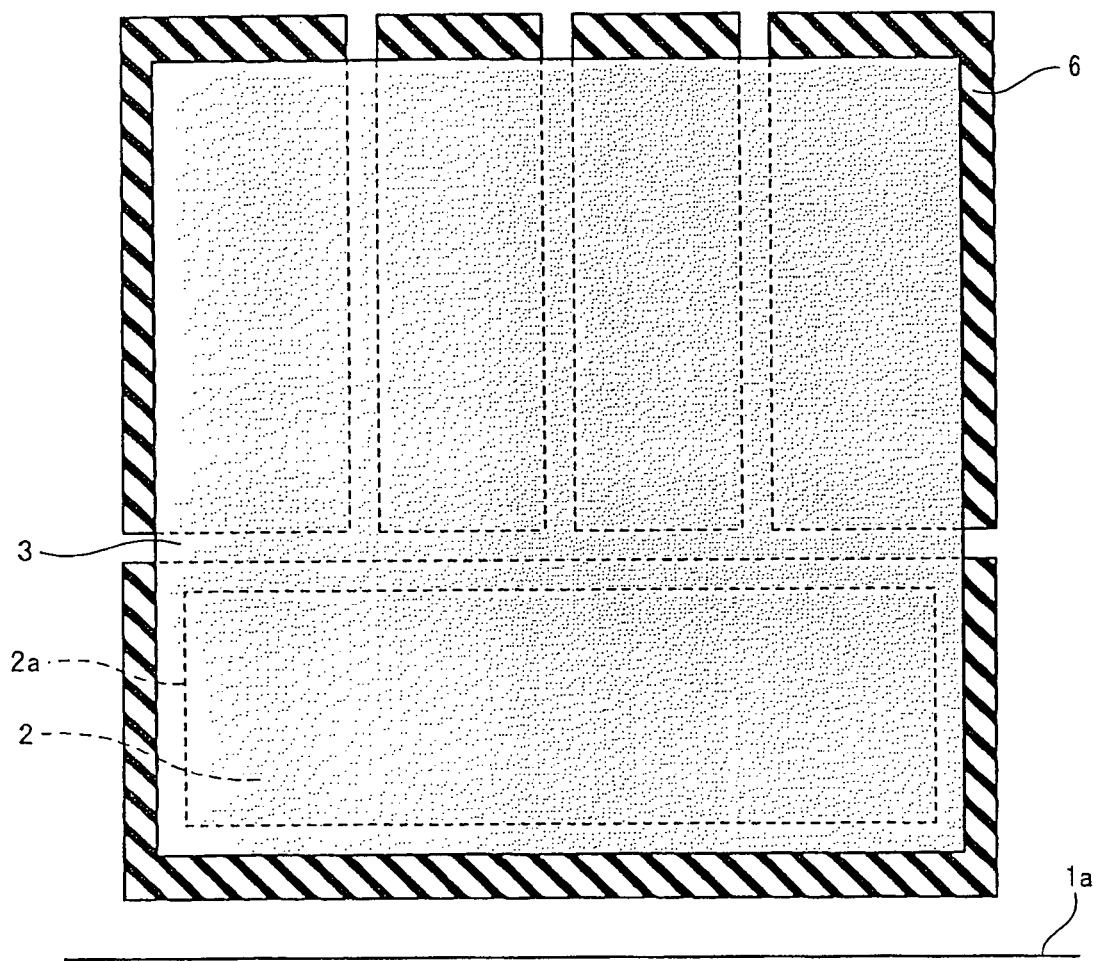
FIG. 6 is a layout showing an electrode pad, wires, and a metal bump in still another input/output pad of the present invention.

In the input/output pad of FIG. 6, a rectangular electrode pad 2 is disposed along an edge 1a of the semiconductor substrate 1, and a metal bump 3 is disposed on the electrode pad 2 and wires 6 disposed inside the electrode pad 2. Also in this electrode structure, the metal bump 3 is formed inside an inclined portion 4b of the protective film 4 as in FIG. 1, thereby obtaining the same effect as the electrode structure of FIG. 1.

In the input/output pads of FIGS. 5 and 6, the edges of the three sides of the metal bump 3 are disposed on the protective film 4 which is provided on the wire 6a or electrode pad 2 formed along the edge 1a of the semiconductor substrate 1. Thus, this structure is effective for a peeling stress which is caused by a difference in thermal expansion coefficient between a semiconductor chip and a tape substrate when the tape substrate is mounted by TCP and so on. That is, since the peeling stress is applied from the outside to inside of the semiconductor chip, when the peeling stress is applied to the lower part of the metal bump 3 and the lower part has a discontinuous portion, a crack is likely to occur. In the structures of FIGS. 5 and 6, the wire 6a or electrode pad 2 formed along the edge 1a of the semiconductor substrate 1 does not have any discontinuous portions and thus a crack is less likely to occur.

Figure 7:
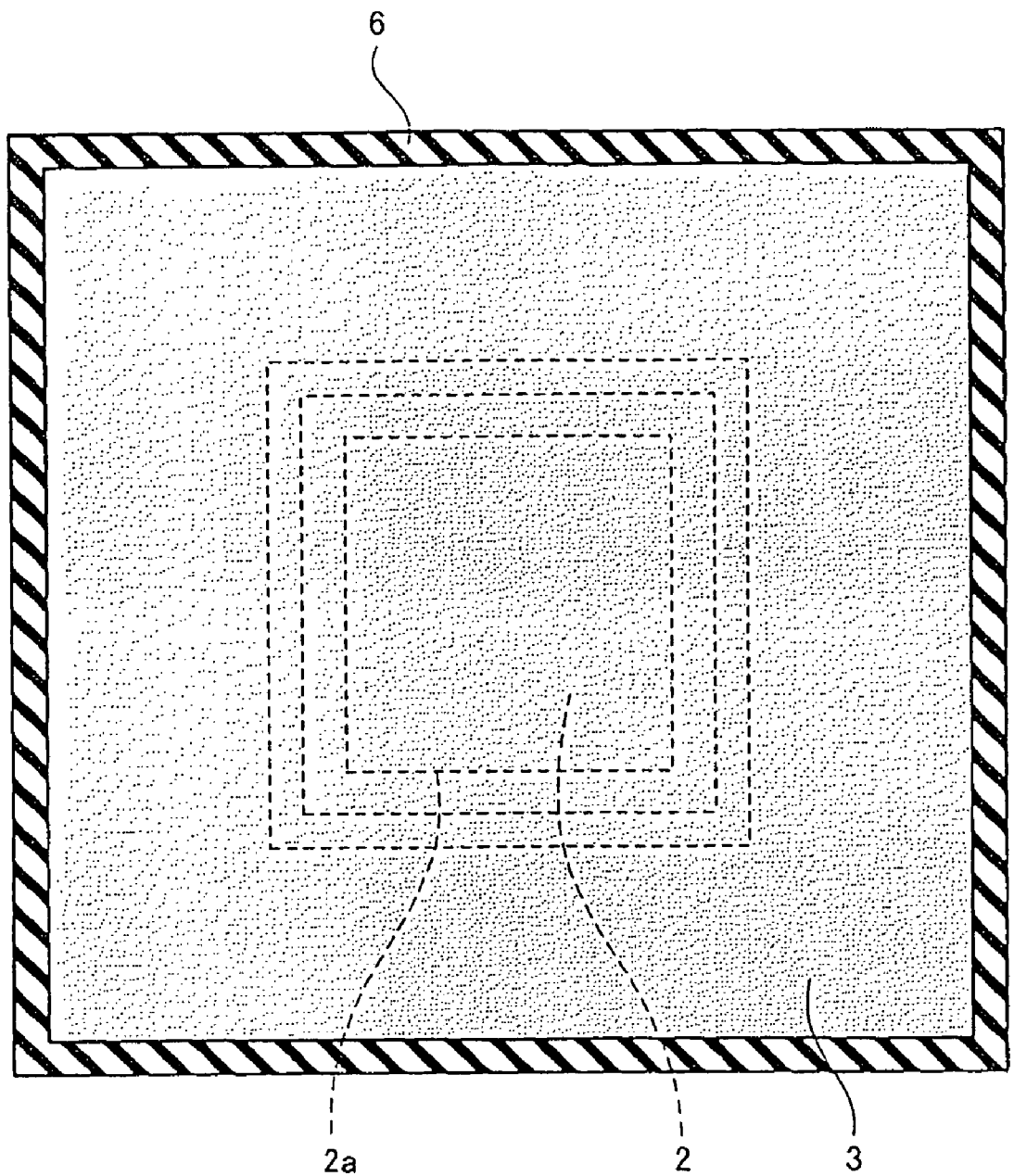
FIG. 7 is a layout showing an electrode pad, wires, and a metal bump in still another input/output pad of the present invention.

In the input/output pad of FIG. 7, a wire 6 shaped like a quadrilateral frame is disposed around a rectangular electrode pad 2, and a metal bump 3 is disposed on the electrode pad 2 and the wire 6. Also in this electrode structure, the metal bump 3 is formed inside an inclined portion 4b of the protective film 4 as in FIG. 1, thereby obtaining the same effect as the electrode structure of FIG. 1. Further, the wire 6 does not have any discontinuous portions in this structure and thus the upper face of a convex portion 3a of the metal bump 3 is further flattened.

Figure 8:
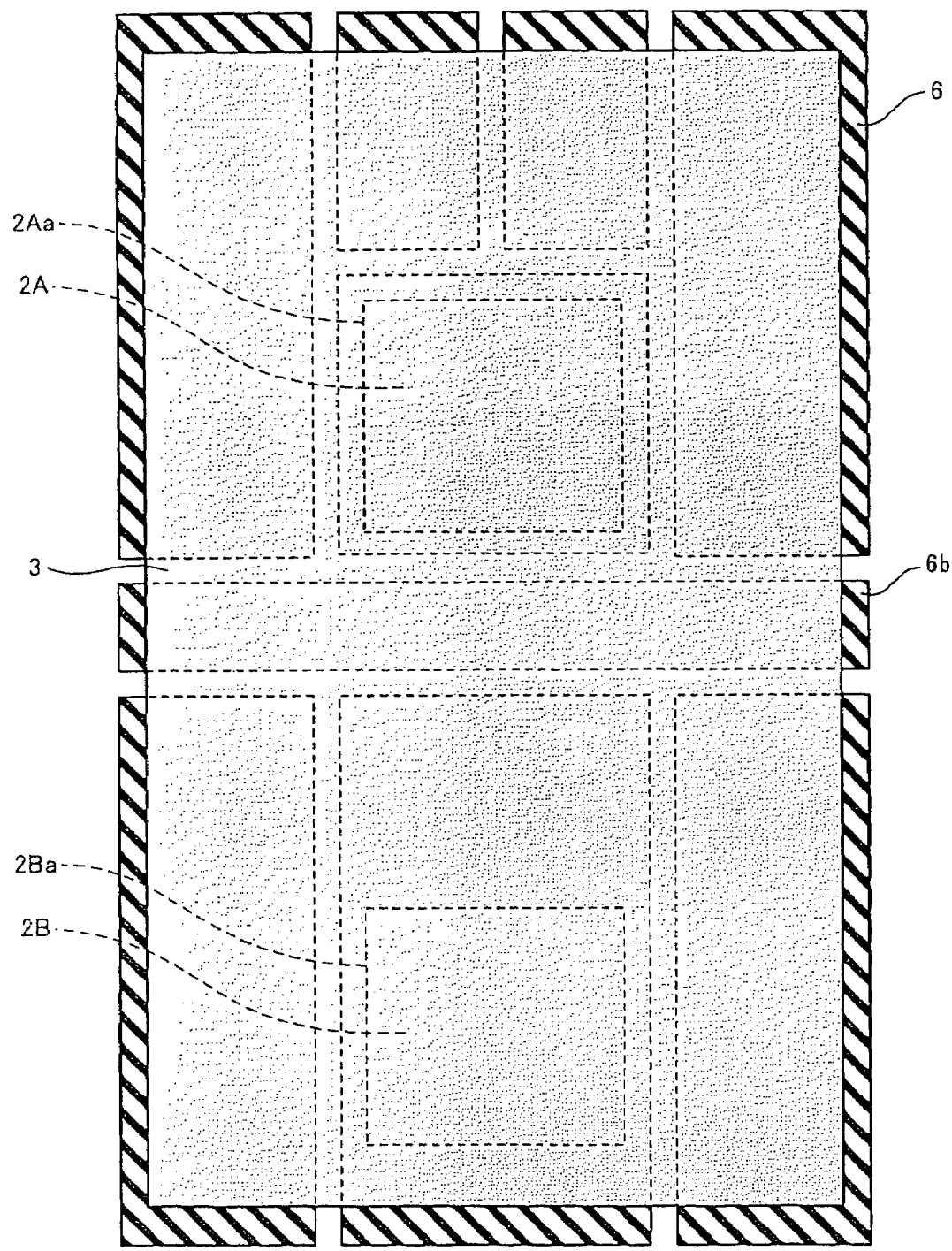
FIG. 8 is a layout showing an electrode pad, wires, and a metal bump in still another input/output pad of the present invention.

In the input/output pad of FIG. 8, a plurality of wires 6 are disposed around two electrode pads 2A and 2B in close vicinity to one another, and a metal bump 3 is disposed on the electrode pads 2A and 2B and the wires 6. To be specific, between the two electrode pads 2A and 2B, a wire 6b stretches along the facing sides. The plurality of wires 6 are disposed around the other three sides of the electrode pad 2A, and the other wires 6 are disposed along the other two sides of the electrode pad 2B.

Also in this electrode structure, the metal bump 3 is formed inside an inclined portion 4b of the protective film 4 as in FIG. 1, thereby obtaining the same effect as the electrode structure of FIG. 1. Further, in this structure, since the metal bump 3 is disposed on the two electrode pads 2A and 2B, even when the electrode pads 2A and 2B have small portion 2Aa and 2Ba exposed from the protective film 4, the bonding stability of the metal bump 3 increases and a flat area on a surface of the metal bump 3 also increases. The wire 6b may be electrically connected to a circuit other than the electrode pads 2A and 2B.

Figure 9:
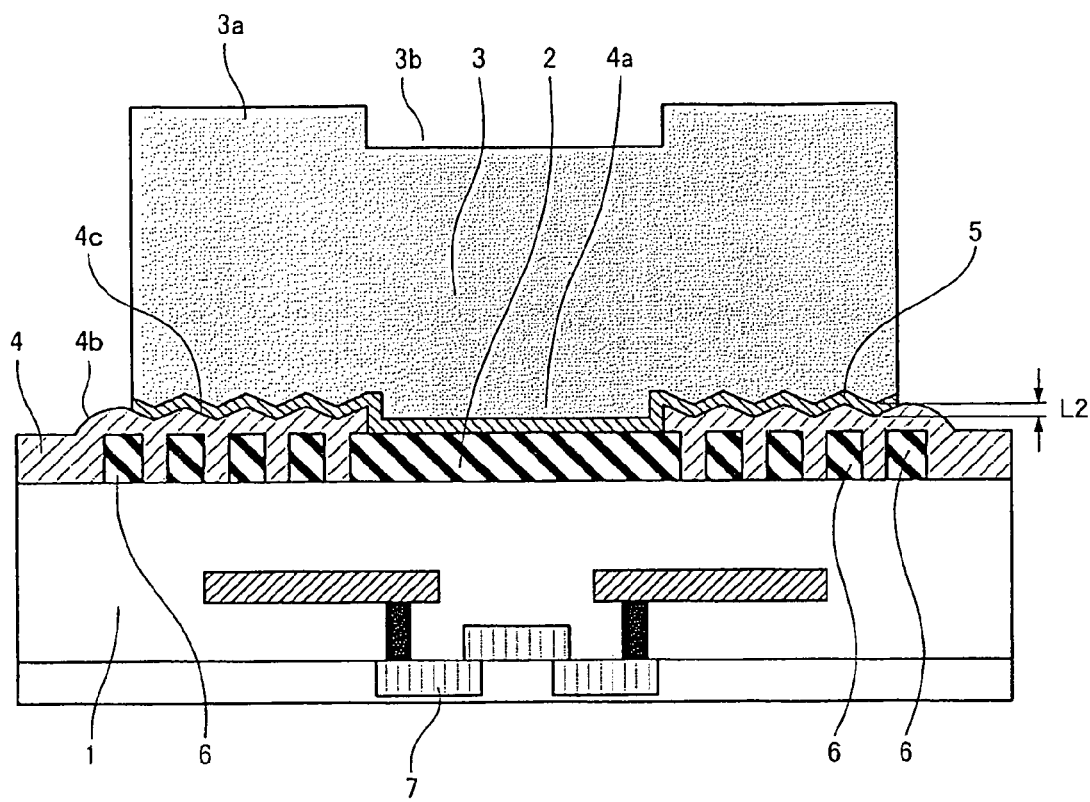
FIG. 9 is a sectional view showing still another input/output pad of the present invention.

In an input/output pad shown in FIG. 9, a plurality of wires 6 around an electrode pad 2 are formed with a small width at small intervals. Thus, on the protective film 4 formed from the edge of the electrode pad 2 to a surface of the semiconductor substrate 1 outside the plurality of wires 6, an inclined portion 4b is formed on a boundary between the surface of the semiconductor substrate 1 and the outer edge of the wire 6 farthest from the electrode pad 2. Moreover, a plurality of inclined portions 4c are formed according to a gap between the wires 6 or a gap between the wire 6 and the electrode pad 2 and the thickness of the protective film 4. Since the gaps are sufficiently small, the plurality of inclined portions 4c are continuously arranged in a zigzag manner.

It is desirable that the protective film 4 have a step of 1 μm or less on the inclined portion 4c. When the step is larger than 1 μm, a convex portion 3a on a metal bump 3 also becomes uneven. When the step is 1 μm or less, the unevenness is absorbed when the metal bump 3 is formed by electrolytic plating. When the inclined portions 4c are continuously arranged in the above manner, a step becomes relatively small and thus a highly uneven portion is less likely to be formed on the convex portion 3a of the metal bump 3.

In the input/output pad formed thus, the upper face of the convex portion 3a of the metal bump 3 has a larger area and becomes almost flat as compared with the conventional structure having no wire 6 near the electrode pad 2. Therefore, the metal bump 3 is more likely to make contact with conductive filler in an anisotropic conductive sheet which is disposed between the metal bump 3 and the mounting substrate such as a glass substrate, thereby obtaining stable bonding. Also during mounting by adding weight from the surface of the metal bump 3, defects such as a crack are less likely to occur on the protective film 4, thereby achieving mounting with a highly stable resistance value.

A specific example of the input/output pad shown in FIG. 9 will be discussed below. The electrode pad 2 was formed with a size of 40×40 μm, the wires 6 were formed with a width of 1 μm, an interval between the adjacent wires 6 and an interval between the wire 6 and the electrode pad 2 were set at 1 μm, and the electrode pad 2 and the wires 6 were formed with a thickness of 900 nm. The protective film 4 was formed thereon with a thickness of about 1000 nm, the barrier metal layer 5 was formed thereon with a thickness of 200 nm, and the metal bump 3 was formed thereon with a thickness of 17 μm such that the outer edge of the metal bump 3 was disposed inside the inclined portion 4b of the protective film 4 by 1 μm.

As a result, the protective film 4 had a step of 300 nm due to the gap between the electrode pad 2 and the wire 6 and the gap between the wires 6, whereas any uneven portion was not particularly formed on the top face of the convex portion 3a of the metal bump 3. The convex portion 3a was positioned on the step. The semiconductor device having the electrode structure was mounted while a weight was added from the surface of the metal bump 3. In this case, bonding was preferably performed without causing any defects such as a crack on the protective film 4.

As described above, according to the semiconductor devices of the present invention, a metal bump for external connection is formed such that an edge of the electrode is also disposed on a wire close to an electrode pad, so that a protective film covering an edge of the electrode pad and an area around the edge can be relatively flat and a flat surface can be formed on the edge of the metal bump on the relatively flat protective film. Therefore, even when the electrode pad is small, it is possible to sufficiently obtain a flat area on a surface of the metal bump, thereby obtaining stable connection via an anisotropic conductive sheet or the like by COG.

The wires are formed around a plurality of electrode pads and the metal bump is formed so as to connect the plurality of electrode pads, so that the bonding stability of the metal bump increases and a flat area on a surface of the metal bump also increases.

The outer edge of the metal bump is disposed inside an inclined portion formed on the protective film according to the arranged electrode pad and a step between the outermost edge of the wire and a surface of the semiconductor substrate outside the outermost edge, thereby reducing cracks caused by a stress of a pressure applied on the protective film during COG mounting.

A gap and a thickness are set such that a plurality of inclined portions are continuously formed on a surface of the protective film on a gap between an electrode pad and the wire and a gap between the wires, so that steps on the inclined portions become relatively small and are absorbed by a metal bump formed thereon. Thus, it is possible to obtain flatness on a surface of the metal bump.

A metal bump is formed such that the edges of the three sides of the electrode are disposed on the protective film on a single electrode pad or wires, thereby increasing a degree of freedom for routing the wires.

The wires are continuously formed around the electrode pad, so that flatness increases on a surface of the metal bump due to the absence of a discontinuous portion on the wires.

What is claimed is:

1. A semiconductor device comprising:
   a semiconductor substrate;
   an electrode pad formed over the semiconductor substrate;
   a plurality of wires in proximity to and around the electrode pad, the plurality of wires being adjacent to each other;
   a protective film covering an edge portion of the electrode pad, the plurality of wires, and a gap between the electrode pad and the plurality of wires, the protective film having an opening over the electrode pad; and
   a metal bump formed over the electrode pad, the metal bump having, on a surface thereof opposite the electrode pad, a concave portion located above the opening of the protective film and a convex portion located above an edge portion of the electrode pad, the plurality of wires, and the gap between the electrode pad and the plurality of wires, and a gap between adjacent wires,
   wherein the gap between the electrode pad and the plurality of wires is not wider than 1 μm,
   the gap between adjacent wires is not wider than 1 μm, and
   an upper face of the convex portion is substantially flat.

2. The semiconductor device according to claim 1, wherein the electrode pad are electrode pad comprises a plurality of electrode pads, the plurality of wires is located around the plurality of electrode pads, and the metal bump is above the plurality of electrode pads.

3. The semiconductor device according to claim 1, wherein one edge of the electrode pad or the plurality of wires is parallel to one edge of the semiconductor substrate on which the electrode pad and the plurality of wires are formed.

4. The semiconductor device according to claim 1, wherein the plurality of wires is arranged around the electrode pad.

5. The semiconductor device according to claim 1, wherein the metal bump is formed of gold (Au) or nickel (Ni).

6. The semiconductor device according to claim 1, wherein
   the metal bump has an outer edge located inside an inclined portion formed on the protective film according to a step between an outermost edge of the electrode pad and the plurality of wires, and a surface of the semiconductor substrate outside said outermost edge, and
   the metal bump has a substantially planar surface except for a depression in a position corresponding to the opening of the protective film on a surface of the metal bump opposite the electrode pad.

* * * * *

UNITED STATES PATENT AND TRADEMARK OFFICE
CERTIFICATE OF CORRECTION

| | |
|---|---|
| PATENT NO. | : 7,642,646 B2 |
| APPLICATION NO. | : 11/050698 |
| DATED | : January 5, 2010 |
| INVENTOR(S) | : Nakamura et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 191 days.

Signed and Sealed this

Sixteenth Day of November, 2010

David J. Kappos
*Director of the United States Patent and Trademark Office*